May 16, 1950 S. J. KARNS 2,508,030

WIRING PATTERN FOR ELECTRICAL APPARATUS

Filed Aug. 2, 1944 2 Sheets-Sheet 1

INVENTOR
SAUL J. KARNS
BY Eric Y. Munson
ATTORNEY

May 16, 1950 S. J. KARNS 2,508,030

WIRING PATTERN FOR ELECTRICAL APPARATUS

Filed Aug. 2, 1944 2 Sheets-Sheet 2

INVENTOR
SAUL J. KARNS
BY Eric G. Jennison
ATTORNEY

Patented May 16, 1950 2,508,030

UNITED STATES PATENT OFFICE 2,508,030

WIRING PATTERN FOR ELECTRICAL APPARATUS

Saul J. Karns, Tuckahoe, N. Y.

Application August 2, 1944, Serial No. 547,721

1 Claim. (Cl. 250—16)

This invention relates to a wiring pattern for electrical apparatus and to the method of producing such wiring pattern.

The invention has particular reference to novel and improved means for wiring radio sets and the like, but it may also be adapted for use in connection with other forms of electrical apparatus.

Heretofore when the various devices such as tube sockets, amplifier, condenser, etc., have been assembled on a radio chassis, it has been necessary to run numerous interconnecting leads between the terminals and to solder the two ends of each of these leads individually to their respective terminals. These leads or wires have to be bent in various places so that no two wires will touch one another and thus cause interference and the arrangement of the interconnecting leads becomes so critical that the radio set may be thrown out of balance by even a slight disarrangement thereof.

Furthermore, the conventional wiring method requires the employment of a skilled mechanic or wireman to make the various connections. This process obviously entails a great deal of time and is subject to errors which must be rectified and these corrections can be made only after the entire device has been completed and after it has been subjected to various inspection tests.

In certain types of radio equipment the position of one wire to another may also affect the operation of the radio or other electrical device. It may therefore be necessary to place certain wires always in the same position. When this is done by hand, it is, of course, subject to the human element and errors may result.

Among the objects of the invention is to provide means whereby such electrical apparatus may be quickly and easily wired by a person unskilled in the field and without the aid of numerous tools.

Another object is to provide a performed wiring pattern which can be manufactured in great numbers and sold as a unit for use in the particular apparatus for which it has been designed.

It is also an object of the invention to provide an improved method of making the wiring pattern and in general to save labor time and to eliminate the human element of error.

Other objects and advantages inherent in the invention will become apparent from the following description which is taken in conjunction with the accompanying drawing and which disclose by way of example an embodiment of the invention.

In terms of broad inclusion the invention contemplates the stamping out of a plurality of sets of conductors according to a predetermined wiring plan from a pair of superimposed sheets of conducting material and insulating material respectively. This can be accomplished by the conventional punch press method using a die which has been made specifically for the wiring plan.

Figures 1, 2, 3, 4, 5:
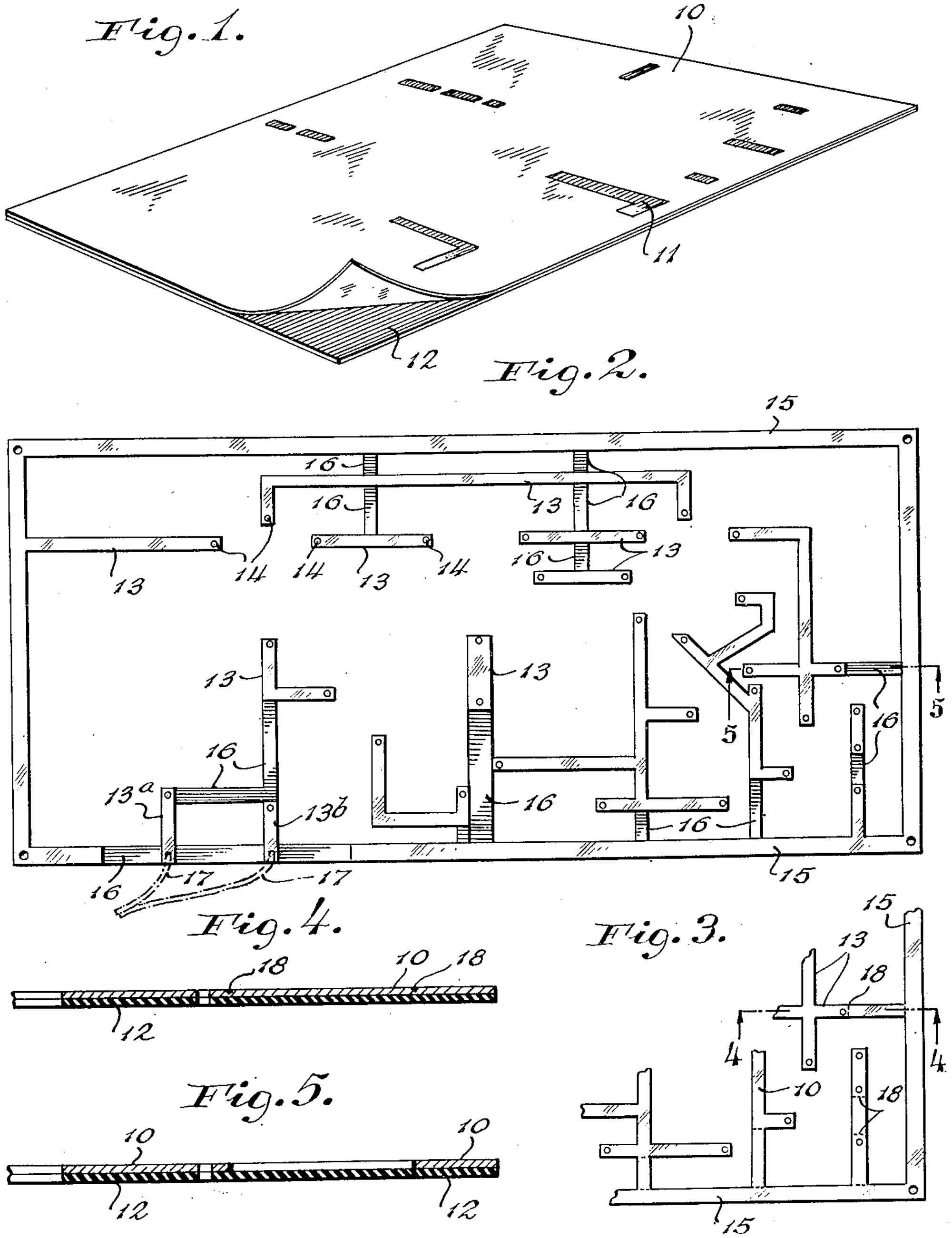
Figure 1 is a perspective view of a pair of superimposed sheets consisting of conducting material and insulating material respectively and from which the wiring pattern according to the invention is stamped out.
Figure 2 is a plan view of the stamped out wiring pattern.
Figure 3 is a fragmentary view of a wiring pattern similar to Figure 2 showing a modification.
Figure 4 is a section taken along the line 4—4 of Figure 3.
Figure 5 is a section taken along the line 5—5 of Figure 2 drawn to an enlarged scale.

Referring in greater detail to Figure 1, the conductor sheet 10 is preferably first stamped out to form a series of holes or slots 11, according to the predetermined design and the purpose of which will hereinafter be explained. The sheet of electrical conductor may be of any size to suit the particular purpose or of any thickness. The material used may be copper, steel, brass or any other metal or alloy suitable for electrical conductivity.

The conductor sheet 10 is then superimposed upon the sheet 12 of insulating material. The insulating material may be hard rubber or any other suitable material. The two sheets are glued or otherwise made to adhere together.

The two superimposed sheets are then placed in a punch press having a die of the predetermined design and the portions of the sheets outside of the portions intended for conductors are punched out leaving a unitary wiring pattern as shown in Figure 2.

The unitary wiring pattern shown in Figure 2 consists of a series of sets of conductors 13 which are provided with holes 14 at their terminal ends to facilitate their connection to the various electrical devices such as condenser, resistor, etc.

In the embodiment shown in Figure 2, the wiring pattern includes a frame 15 which serves the purpose of reinforcement as well as ground for some of the conductors 13. To this frame may also the wires to the electrical source be connected.

The holes 11 previously punched out from the conductor sheet 10 leave connecting strips or members 16 consisting of insulating material only. These connecting strips serve to hold the various sets of conductors together and insulate them from one another.

In the embodiment shown in Figure 2, the majority of the connecting strips 16 support the conductors within the frame 15, but it will be understood that the frame 15 may be omitted entirely where the circumstances so warrant and in which case the connecting strips 16 simply join together the various sets of conductors.

As previously indicated, the wires 17 to the wall outlet may be connected to the frame 15 for direct electrical connection with the conductor elements 13*a* and 13*b*. For this reason, part of the conductor material is removed from the frame adjacent the conductors 13*a* and 13*a* so that proper insulation will be provided. This can, of course, be done by stamping out the corresponding portion from the conductor sheet prior to superimposing it on the insulating sheet.

The pattern thus described consists of a series of sets of conductors and a frame, which latter may be omitted, consisting of superimposed layers of conducting material and insulating material respectively. The pattern is pliable so that it may be bent into any desired shape.

In the modification shown in Figure 3, the conductor elements 13 are punched out in a single operation without first punching out slots in the conductor sheet to form the connecting strips 16. Instead, the conductor element is scored as shown at 18. The portion of the conductor element defined between the scoring lines may then be removed.

It will, of course, also be understood, that the conductor elements as well as the connecting strips, could be punched out in a single operation from a single die without departing from the invention. Thus the preliminary punching of the conductor sheet as shown in Figure 1, as well as the subsequent removal of the conductor material as shown in Figure 3 may be eliminated.

Figure 6:
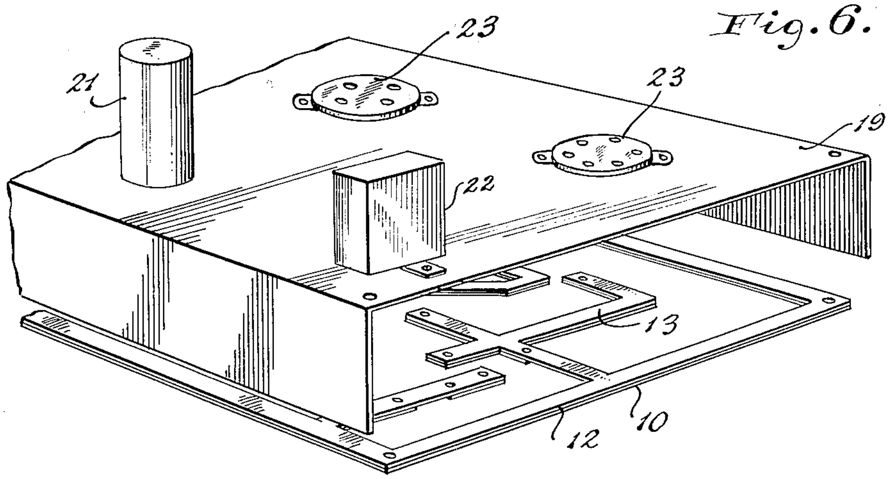
Figure 6 is a fragmentary perspective view of a radio chassis showing the wiring pattern according to the invention in position for installation.
Figure 7:
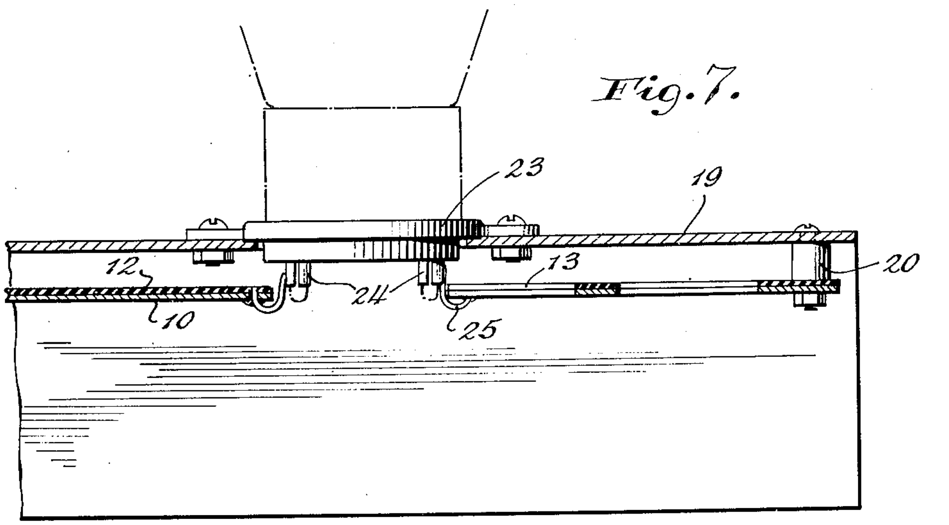
Figure 7 is a fragmentary section through the radio chassis showing the conductors of the wiring pattern hooked up to the terminal of the tube socket.
Figure 8:
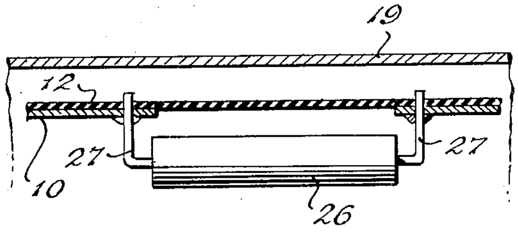
Figure 8 is another fragmentary section showing the conductors of the wiring pattern hooked up to the condenser.

This unitary wiring pattern thus formed may be connected to a radio chassis 19 or other electrical device as shown in Figures 6, 7 and 8. The pattern is placed underneath the chassis with the layer of insulating material facing upward and riveted, screwed or otherwise fastened into place. In the embodiment shown in Figure 7, stand-off mounts 20 are used for spacing the pattern from the top surface of the chassis, but it will be understood that because of the layer of insulating material, the pattern may lie flat against the chassis if desired.

It will be also understood that the chassis may be eliminated entirely as the pattern is self-sustaining and sufficiently rigid to support the various electrical devices.

The conductor elements 13 are then simply soldered to the connections for the various devices, such as the intermediate frequency coil 21, the radio transformer 22, and the tube sockets 23.

As shown by way of example in Figure 7, the conductor element 13 is connected to the socket prong 24 by means of the soldering lug 25 which is inserted into the aperture 14 of the conductor element.

Figure 8 shows a condenser 26 inserted between the terminal points of two conductor elements. The condenser wires 27 are simply inserted into the apertures 14 of the conductor elements and soldered.

It will be understood that when circumstances so require a plurality of wiring patterns may be superimposed upon one another. This arrangement may be preferable where a great number of conductors are required which would make one single pattern a maze of conductors.

It will also be understood that this disclosure is given by way of example and not by way of limitation. The invention may lend itself to a variety of expressions within the scope of the appended claim.

What I claim is:

In an electrical apparatus, the combination of a plurality of electrical devices, a wiring pattern comprising means for connecting said devices in a predetermined radio circuit including sets of conductors having terminal portions for receiving certain terminals of certain of said devices, a frame for supporting said conductors and for grounding some of said conductors, said conductors and said frame consisting of a layer of conducting material superimposed upon a layer of insulating material, and connecting members consisting of insulating material only supporting some of said conductors within said frame, each of said conductors and said connecting members being formed integrally with said pattern.

SAUL J. KARNS.

REFERENCES CITED

The following references are of record in the file of this patent:

UNITED STATES PATENTS

| Number | Name | Date |
|---|---|---|
| 1,803,017 | Herschmann | Apr. 28, 1931 |
| 2,066,511 | Arlt | Jan. 5, 1937 |
| 2,182,968 | Lunsford | Dec. 12, 1939 |

FOREIGN PATENTS

| Number | Country | Date |
|---|---|---|
| 269,729 | Great Britain | Apr. 28, 1927 |
| 344,677 | Great Britain | Mar. 12, 1931 |